(12) United States Patent
Sonoda et al.

(10) Patent No.: US 10,069,110 B2
(45) Date of Patent: Sep. 4, 2018

(54) ORGANIC EL DISPLAY DEVICE

(71) Applicant: Sharp Kabushiki Kaisha, Sakai, Osaka (JP)

(72) Inventors: Tohru Sonoda, Sakai (JP); Takeshi Hirase, Sakai (JP); Tetsuya Okamoto, Sakai (JP); Tohru Senoo, Sakai (JP); Daichi Nishikawa, Sakai (JP); Mamoru Ishida, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/532,777

(22) PCT Filed: Nov. 30, 2015

(86) PCT No.: PCT/JP2015/005951
§ 371 (c)(1),
(2) Date: Jun. 2, 2017

(87) PCT Pub. No.: WO2016/088355
PCT Pub. Date: Jun. 9, 2016

(65) Prior Publication Data
US 2017/0365815 A1    Dec. 21, 2017

(30) Foreign Application Priority Data

Dec. 5, 2014  (JP) ................................ 2014-246977

(51) Int. Cl.
*H01L 35/24*     (2006.01)
*H01L 51/00*     (2006.01)
(Continued)

(52) U.S. Cl.
CPC ...... *H01L 51/5256* (2013.01); *H01L 51/5246* (2013.01); *H01L 51/5259* (2013.01);
(Continued)

(58) Field of Classification Search
CPC ............. H01L 51/5256; H01L 51/5246; H01L 51/5259
(Continued)

(56) References Cited

U.S. PATENT DOCUMENTS

2003/0206332 A1   11/2003   Yamazaki et al.
2005/0030612 A1    2/2005   Yamazaki et al.
(Continued)

FOREIGN PATENT DOCUMENTS

JP    2001-345174 A    12/2001
JP    2006-004650 A     1/2006
(Continued)

*Primary Examiner* — David S Blum
(74) *Attorney, Agent, or Firm* — ScienBiziP, P.C.

(57) ABSTRACT

A the organic EL display 1 includes: a first substrate 10; an organic EL element 4 provided above the first substrate 10; and a multilayer sealing film 2 provided above the first substrate 10 to cover the organic EL element 4, and including a barrier layer and a buffer layer lower in hardness than the barrier layer. The organic EL element covered with the multilayer sealing film includes a protrusion, and a relationship (d/h)<2 holds where h is a height of the protrusion directly below the buffer layer and d is a thickness of the buffer layer.

17 Claims, 5 Drawing Sheets

(51) Int. Cl.
  *H01L 51/52* (2006.01)
  *H01L 27/32* (2006.01)
(52) U.S. Cl.
  CPC ...... *H01L 27/3246* (2013.01); *H01L 51/0097* (2013.01); *H01L 2251/5338* (2013.01)
(58) Field of Classification Search
  USPC .......................................................... 257/40
  See application file for complete search history.

(56) References Cited

U.S. PATENT DOCUMENTS

| | | |
|---|---|---|
| 2006/0104045 A1 | 5/2006 | Yamazaki et al. |
| 2008/0067932 A1 | 3/2008 | Baek et al. |
| 2014/0014909 A1 | 1/2014 | Lee et al. |

FOREIGN PATENT DOCUMENTS

| | | | | |
|---|---|---|---|---|
| JP | 2008-072078 A | | 3/2008 | |
| JP | 2010-027502 | * | 2/2010 | ............. H05B 33/84 |
| JP | 2010-027502 A | | 2/2010 | |

* cited by examiner

ORGANIC EL DISPLAY DEVICE

TECHNICAL FIELD

A technique disclosed in the DESCRIPTION relates to an organic electroluminescence (EL) display device including an organic EL element.

BACKGROUND ART

In recent years, liquid crystal displays are often used as flat panel displays in various fields. However, the following problems still remain. Contrast and tinge greatly vary depending on viewing angles. A need for a light source such as a backlight hinders lower power consumption. Reduction in the thickness and weight of a liquid crystal device is limited. Moreover, liquid crystal devices still have problems in flexibility.

To address the problems, self-luminous organic EL displays using organic EL elements are expected in place of liquid crystal displays. In an organic EL element, a current flows through organic EL layers sandwiched between an anode and a cathode so that organic molecules forming the organic EL layers emit light. Being self-luminous, organic EL displays using such an organic EL element are thin, light, and low in power consumption. In addition, organic EL displays provide a wide viewing angle, and thus draw great attention as a candidate for flat panel displays in the next generation. Moreover, such organic EL displays can be superior to liquid crystal displays in terms of flexibility. Taking advantage of their thinness and wide viewing angle, Organic EL displays are being put into practical use as main displays for portable audio devices and cellular phones.

Patent Document 1 discloses a display element including: an effective part having display elements; and a sealing body arranged so as to cover at least the effective part of a main surface of a substrate.

The sealing body includes a buffer layer and a barrier layer to keep an organic EL element from moisture.

CITATION LIST

Patent Document

PATENT DOCUMENT 1: Japanese Unexamined Patent Publication No. 2006-004650

SUMMARY OF THE INVENTION

Technical Problem

The buffer layer included in the sealing body is low in hardness. When shear stress is imposed on the buffer layer, the imposed shear stress can create a continuous line of fracture in the buffer layer, causing delamination of a film.

The present disclosure is intended to provide an organic EL display device in which a sealing film is less vulnerable to delamination.

Solution to the Problem

An organic EL display device disclosed in the DESCRIPTION includes: a first substrate; an organic EL element provided above the first substrate; and a multilayer sealing film provided above the first substrate to cover the organic EL element, and including a barrier layer and a buffer layer lower in hardness than the barrier layer. The organic EL element covered with the multilayer sealing film includes a protrusion, and a relationship (d/h)<2 holds where h is a height of the protrusion directly below the buffer layer and d is a thickness of the buffer layer.

Advantages of the Invention

In the organic EL display device according to the present disclosure, a multilayer sealing film is less vulnerable to delamination.

DESCRIPTION OF EMBODIMENTS

Embodiments of the present disclosure will now be described in detail with reference to the drawings. The present disclosure is not limited to the following embodiments.

(First Embodiment)

Figure 1:
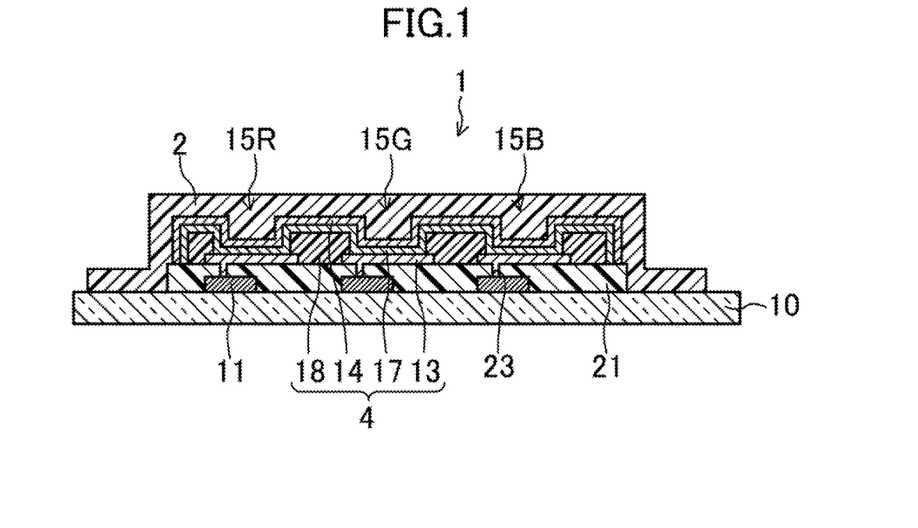
FIG. 1 is a cross-sectional view illustrating an organic EL display device according to a first embodiment of the present disclosure.
Figure 2:
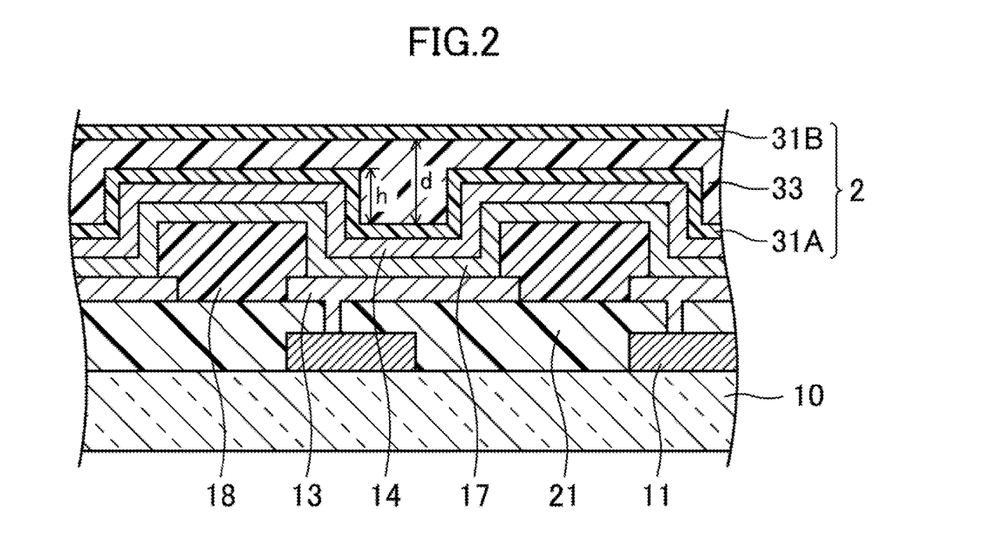
FIG. 2 is a cross-sectional view illustrating a structure of a multilayer sealing film in the organic EL display device according to the first embodiment.

FIG. 1 is a cross-sectional view illustrating an organic EL display device 1 according to a first embodiment of the present disclosure. FIG. 2 is an enlarged cross-sectional view illustrating a structure of a multilayer sealing film 2 in the organic EL display device 1 according to the first embodiment.

As shown in FIG. 1, the organic EL display device 1 includes: an element substrate 10 acting as a first substrate; an organic EL element 4 provided above the element substrate 10; and the multilayer sealing film 2 provided above the element substrate 10 to cover each of organic EL elements 4. The element substrate 10 contains such insulating materials as glass and plastic.

The multilayer sealing film 2 includes at least one barrier layer, and at least one buffer layer which is lower in hardness than the barrier layer. In an example illustrated in FIG. 2, the multilayer sealing film 2 includes a barrier layer 31A, a barrier layer 32B, and a buffer layer 33 sandwiched between the barrier layer 31A and the barrier layer 31B.

The barrier layer 31A and the barrier layer 31B function to keep the organic EL element 4 from moisture and oxygen. The buffer layer 33 functions to reduce and distribute stress when a barrier layer is formed above the buffer layer 33 so as to reduce the risk of film delamination.

The buffer layer 33 contains such a material as polysiloxane, silicon oxycarbide, acrylate, polyurea, parylene, polyimide, or polyamide. The barrier layer 31A and the barrier layer 31B contain silicon nitride, silicon oxide, silicon oxynitride, or $Al_2O_3$.

A thickness of the multilayer sealing film 2 may beneficially be, but not limited in particular to, within a range between 1 μm and 100 μm in view of sufficiently enhancing durability of the organic EL element 4. A thickness of the barrier layer 31A and the barrier layer 31B is within a range between, for example, 0.1 μm and 5 μm. A thickness of the buffer layer 33 is within a range between, for example, 0.3 μm and 100 μm, and more beneficially, between 0.3 μm and 5 μm.

The example illustrated in FIG. 2 shows that a top face of the barrier layer 31B is flat; however, the top face of the barrier layer 31B may have a recess and a protrusion in conformity with a recess and a protrusion of an underlayer below the barrier layer 31B.

The organic EL elements 4 are arranged above the element substrate 10 in a matrix. The element substrate 10 has a display region (a region except an end) 15 in which a pixel region 15R emitting red light, a pixel region 15G emitting green light, and a pixel region 15B emitting blue light are arranged in accordance with a predetermined pattern.

The organic EL elements 4 include: first electrodes 13 (anodes) arranged above the element substrate 10 in a predetermined array (e.g., in a matrix); an organic EL layer 17 formed above the first electrodes 13; a second electrode 14 formed above the organic EL layer 17; and edge covers 18 provided to cover peripheral edges of the first electrodes 13 and regions in which the first electrodes 13 are not provided. Provided between the pixel regions 15R, 15G, and 15B, the edge covers 18 function as partitions to separate the pixel regions 15R, 15G, and 15B from one another.

In the organic EL element 4, a top face above an edge cover 18 is positioned higher than other top faces. In other words, the edge cover 18 forms a protrusion of the organic EL element 4.

Moreover, as shown in FIG. 1, the organic EL display device 1 includes TFTs 11 and interlayer insulating films 21. Each of TFTs 11 is formed above the element substrate 10, and electrically connected to a corresponding one of the first electrodes 13. The interlayer insulating films 21 are formed above the element substrate 10 to cover the TFTs 11. The first electrodes 13 are connected to the corresponding TFTs 11 in portions provided in the contact holes 23.

The first electrodes 13 function to inject holes into the organic EL layer 17. The first electrodes 13 beneficially contain a material with a high work function. This is because a material with a high work function allows the first electrodes 13 to inject holes to the organic EL layer 17 with higher efficiency. Furthermore, as shown in FIG. 1, the first electrodes 13 are formed above the interlayer insulating films 21.

Exemplary materials for the first electrodes 13 may include metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Moreover, the first electrodes 13 may also be an alloy of magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), or lithium fluoride (LiF)/calcium (Ca)/aluminum (Al). Furthermore, the first electrodes 13 may be such a conductive oxide as tin oxide (SnO), zinc oxide (ZnO), or indium tin oxide (ITO), and indium zinc oxide (IZO).

Moreover, the first electrodes 13 may be multilayers containing the above materials. Materials with a high work function may include, for example, indium tin oxide (ITO) and indium zinc oxide (IZO).

Formed above the element substrate 10, the interlayer insulating films 21 function to planarize surfaces of the TFTs 11. This interlayer insulating films 21 may planarize the first electrodes 13 and the organic EL layer 17 to be formed above the interlayer insulating films 21. That is, the planarization using the interlayer insulating films 21 reduces the risk that steps, protrusions, and recesses of the underlayers in the organic EL display device 1 influence the shape of the surface of the first electrodes 13, causing light emission by the organic EL layer 17 to be non-uniform. The interlayer insulating films 21 contain a highly transparent, low-cost organic resin material such as acrylic resin.

Each organic EL layer 17 is formed on a surface of a corresponding one of the first electrodes 13 arranged in a matrix. This organic EL layer 17 includes a hole injection layer (not shown), a hole transport layer, a light-emitting layer, an electron transport layer, and an electron injection layer. The hole transport layer is formed on a surface of the hole injection layer. The light-emitting layer is formed on a surface of the hole transport layer, and emits any one of red light, green light, and blue light. The electron transport layer is formed on a surface of the light-emitting layer. The electron injection layer is formed on a surface of the electron transport layer.

The hole injection layer, the hole transport layer, the light-emitting layer, the electron transport layer, and the electron injection layer are sequentially stacked to constitute the organic EL layer 17. The organic EL layer 17 may be smaller in area than the underlying first electrodes 13 or larger in area than the underlying first electrodes 13 to cover the first electrodes 13.

The hole injection layer is also called an anode buffer layer, which approximates the energy levels between the work function of the first electrodes 13 and a highest occupied molecular orbital (HOMO) of the organic EL layer 17 to increase the efficiency in the hole injection.

Exemplary materials for the hole injection layer may include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer functions to improve efficiency in transporting the holes from the first electrodes 13 to the organic EL layer 17. An exemplary material for the hole transport layer may include porphyrin derivatives, aromatic tertiary amine compounds, styryl amine derivatives, polyvinylcarbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, or zinc selenide.

The light-emitting layer is a region in which the holes and the electrons are injected thereinto from the first electrodes 13 and second electrode 14 and recombine with each other when a voltage is applied from the first electrodes 13 and the second electrode 14. This light-emitting layer contains a material with high luminous efficiency. The material may be metal oxinoid compounds [8-hydroxyquinoline metal complexes], naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rodamine derivatives, acridine derivatives, phenoxazone, quinacridone derivatives, rubrene, poly-P-phenylene vinylene, or polysilane.

The electron transport layer functions to efficiently transport the electrons to the light-emitting layer. Exemplary materials for the electron transport layer may include, as organic compounds, oxadiazole derivatives, triazole derivatives, benzoquinone derivatives, naphthoquinone derivatives, anthraquinone derivatives, tetracyanoanthraquinodimethan derivatives, diphenoquinone derivatives, fluorenone derivatives, silole derivatives, and metal oxinoid compounds.

The electron injection layer approximates the energy levels between the second electrode 14 and the organic EL layer 17 to increase the efficiency in injecting electrons from the second electrode 14 into the organic EL layer 17, thereby reducing the drive voltage of the organic EL element 4. The electron injection layer may also be called a cathode buffer layer. Materials for the electron injection layer may include, for example, $Al_2O_3$, SrO, and such inorganic alkaline compounds as lithium fluoride (LiF), magnesium fluoride magnesium fluoride ($MgF_2$), calcium fluoride ($CaF_2$), strontium fluoride ($SrF_2$), and barium fluoride ($BaF_2$).

The second electrode 14 functions to inject electrons into the organic EL layer 17. The second electrode 14 may beneficially contain a material with a low work function. This is because a material with a low work function allows the second electrode 14 to inject electrons into the organic EL layer 17 with higher efficiency. As shown in FIG. 1, the second electrode 14 is formed above the organic EL layer 17.

Materials for the second electrode 14 may include, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 14 may also be an alloy of magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), and lithium fluoride (LiF)/calcium (Ca)/aluminum (Al). The second electrode 14 may also contain a conductive oxide such as tin oxide (SnO), zinc oxide (ZnO), or indium tin oxide (ITO) and indium zinc oxide (IZO). The second electrode 14 may be a multilayer containing the above materials.

A material with a low work function may be, for example, magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), or lithium fluoride (LiF)/calcium (Ca)/aluminum (Al).

The edge covers 18 function to reduce short-circuit between the first electrodes 13 and the second electrode 14. Thus, the edge covers 18 beneficially cover entire peripheral edges of the first electrodes 13.

The edge covers 18 may contain such materials as a photosensitive resin organic film including polyimide resin, acrylic resin, polysiloxane resin, and novolak resin, or an inorganic film including silicon dioxide ($SiO_2$).

As shown in FIG. 2, the following relationship holds in the organic EL display device 1 of this embodiment: (d/h)<2 where h is a height of a protrusion directly below the multilayer sealing film 2 and d is a thickness of the buffer layer 33. Here, the thickness of the buffer layer 33 means a thickness, of the buffer layer 33, in a region between protrusions. Moreover, the height h of the protrusion directly below the buffer layer 33 is almost equal to a height of a protrusion of the organic EL element 4. More accurately, the height h of the protrusion directly below the buffer layer 33 is equal to a difference in level between (i) a top face of a portion, of the barrier layer 31A, forming the protrusion and (ii) another top face (a recess) of a portion, of the barrier layer 31A, formed between protrusions including the protrusion.

The height h of the protrusion ranges approximately between 0.5 μm and 3 μm, for example. Here, the height h is 1.6 μm. The thickness d of the buffer layer 33 ranges approximately between 0.3 μm and 100 μm, as described above, and more beneficially, approximately between 0.3 μm and 5 μm. Here the thickness d is 2.5 μm.

Figure 3:
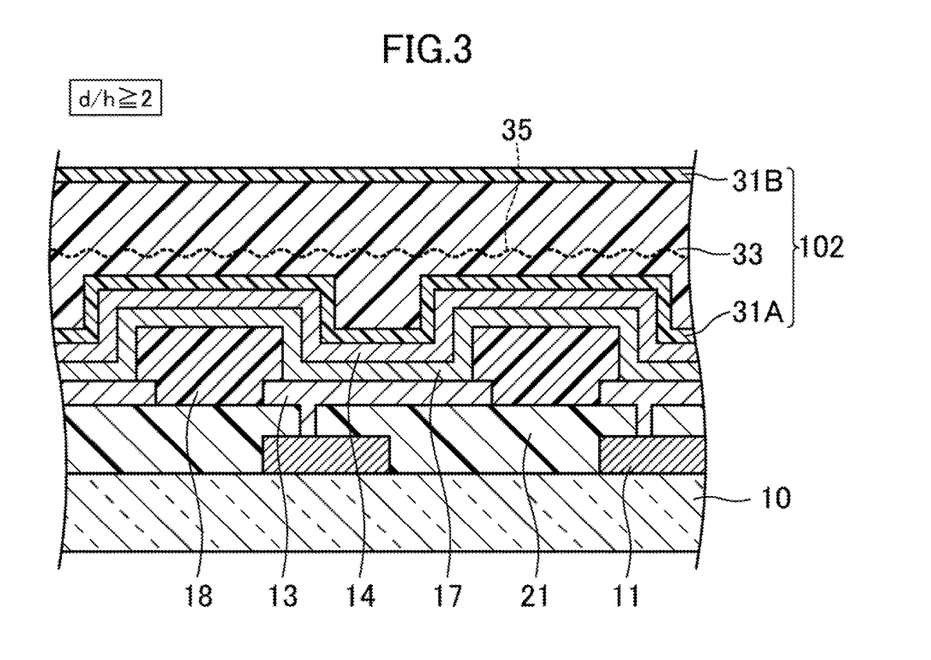
FIG. 3 is a cross-sectional view illustrating a line of fracture created in an organic EL display device according to a reference.
Figure 4:
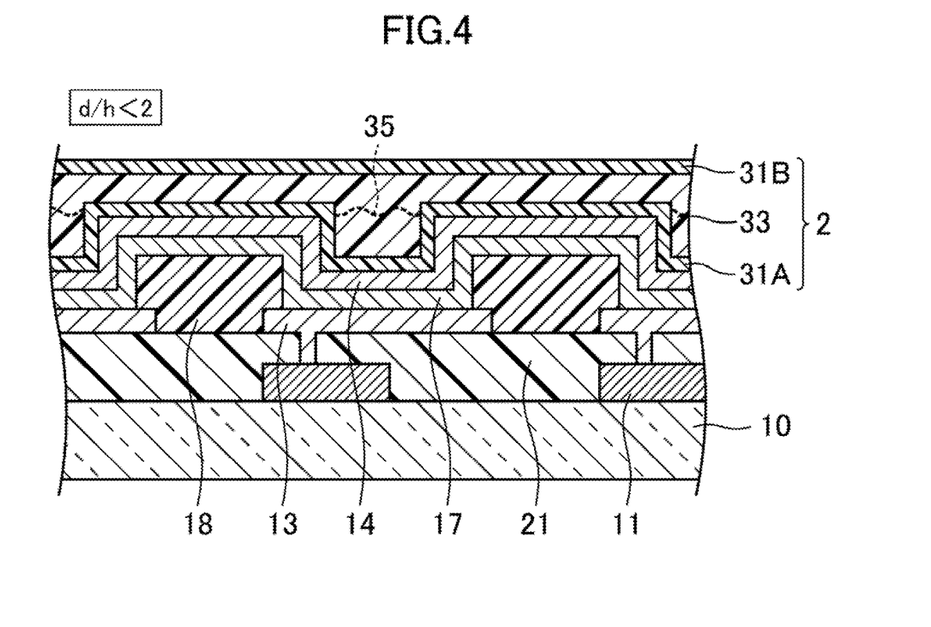
FIG. 4 is a cross-sectional view illustrating a line of fracture created in an organic EL display device according to the first embodiment.

FIG. 3 is a cross-sectional view illustrating a line of fracture created in an organic EL display device according to a reference. FIG. 4 is a cross-sectional view illustrating a line of fracture created in the organic EL display device 1 according to the first embodiment. The relationship (d/h)≥2 applies to the organic EL display device illustrated in FIG. 3. In the organic EL display device 1 of this embodiment, the relationship (d/h)<2 holds.

The buffer layer 33 lower in hardness than the barrier layer 31A and the barrier layer 31B in order to reduce stress. Hence, the buffer layer 33 is susceptible to fracture caused by stress—sheer stress—imposed from the barrier layer 31B placed above the buffer layer 33 and created because of temperature change. Here, portions, of the buffer layer 33, having contact with the barrier layer 31A and the barrier layer 31B are closely attached to the barrier layer 31A and the barrier layer 31B. Thus, an intermediate portion of the buffer layer 33 in a vertical direction is most vulnerable against the shear stress.

Hence, as shown in FIG. 3, the organic EL display device according to the reference has a line of fracture 35 continuously developed near the middle of the buffer layer 33, making a multilayer sealing film 102 more prone to delamination.

In contrast, as shown in FIG. 4, the relationship (d/h)<2 holds in the organic EL display device 1 of this embodiment. That is why the line of fracture 35 develops only in a region between the edge covers 18, and does not develop continuously. Hence, even if the line of fracture 35 develops in the buffer layer 33, the delamination of the multilayer sealing film 2 may be effectively reduced.

Described next is an exemplary method of manufacturing the organic EL display device 1 of this embodiment. FIGS. 5 to 8 are cross-sectional views illustrating a method of manufacturing the organic EL display device 1 according to this embodiment.

Figure 5:
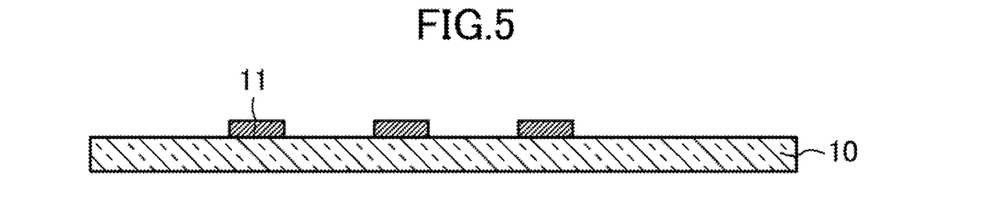
FIG. 5 is a cross-sectional view illustrating a method of manufacturing the organic EL display device according to the first embodiment.

First, in a step shown in FIG. 5, the TFTs 11 for driving the organic EL elements 4 are formed at predetermined intervals on the element substrate 10. The element substrate 10 may be a glass substrate having a size of 320 mm×400 mm and a thickness of 0.7 mm. Materials for the TFTs 11 may include amorphous silicon, polysilicon, indium gallium zinc oxide (InGaZnO), indium gallium tin oxide (InGaSnO), and indium tin zinc oxide (InSnZnO). The TFTs 11 are manufactured by a known technique.

Figure 6:
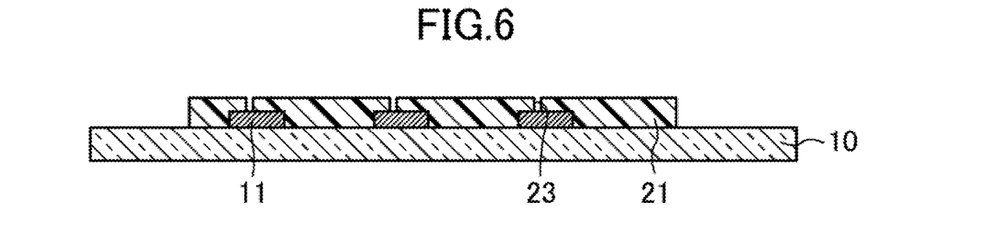
FIG. 6 is a cross-sectional view illustrating the method of manufacturing the organic EL display device according to the first embodiment.

Next, in a step shown in FIG. 6, photosensitive acrylic resin is applied by spin coating on the element substrate 10 on which the TFTs 11 are formed. The photosensitive acrylic resin is exposed to a predetermined amount (e.g., 360 mJ/cm$^2$) of light through an exposure mask with a predetermined exposure pattern. Then, the photosensitive acrylic resin is developed, using an alkaline developer. As a result, the interlayer insulating film 21 having a thickness of, for example, 2 μm is formed. After the exposure, the interlayer insulating film 21 is baked in post-baking under a predetermined condition (e.g., at a temperature of 220 C° for 120 minutes).

At this time, on the interlayer insulating film 21, the contact holes 23 (having a diameter of 5 μm, for example) are formed for electrically connecting the first electrodes 13 to the TFTs 11.

Figure 7:
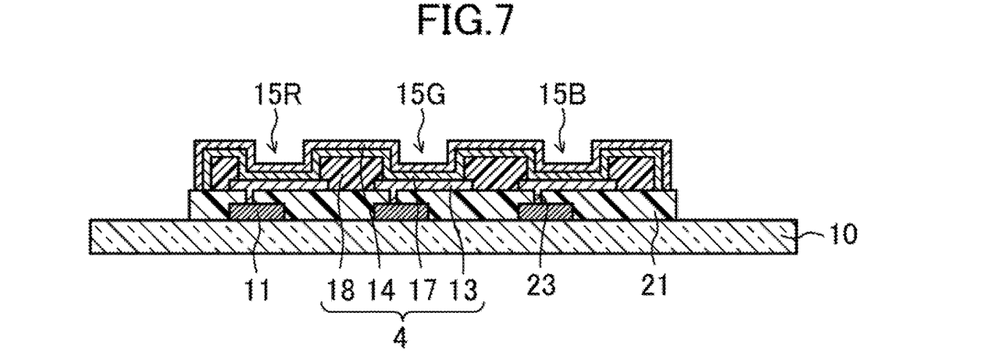
FIG. 7 is a cross-sectional view illustrating the method of manufacturing the organic EL display device according to the first embodiment.

In a step shown in FIG. 7, an ITO film is formed by sputtering, exposed to light and developed by photolithography, and patterned by etching to form the first electrodes 13 on the interlayer insulating film 21. At this time, the first electrodes 13 have a thickness of approximately 100 nm, for example. After the exposure, the first electrodes 13 are baked in post-baking under a predetermined condition (e.g., at a temperature of 220 C° for 120 minutes). The first electrodes 13 are electrically connected to the TFTs 11 via the contact holes 23 formed in the interlayer insulating film 21.

Next, photosensitive acrylic resin is used to form the edge covers 18 to cover the entire peripheral edges of the first electrodes 13, using a similar method employed when the interlayer insulating film 21 is formed. At this time, the edge covers 18 have a thickness of approximately 2 μm, for example.

Then, the organic EL layer 17 including the light-emitting layer is formed above the first electrodes 13, and after that, the second electrode 14 is formed above the organic EL layer 17. The organic EL layer 17 and the second electrode 14 are formed by vapor deposition, using a metal mask.

More specifically, first, the element substrate 10 having the first electrodes 13 is placed in a chamber of a vapor deposition system. The chamber interior of the vapor deposition system is kept at a vacuum degree of $1\times10^{-5}$ Pa to $1\times10^{-4}$ Pa by a vacuum pump. Moreover, the element substrate 10 having the first electrodes 13 is placed while two sides of the element substrate 10 is secured with a pair of substrate holders provided to the interior of the chamber.

In an evaporation source, source materials (evaporants) for the hole injection layer, the hole transport layer, the light-emitting layer, the electron transport layer, and the electron injection layer are sequentially evaporated and then stacked to form the organic EL layer 17 in pixel regions.

Then, the second electrode 14 is formed above the organic EL layer 17. As a result, the organic EL element 4 including the first electrodes 13, the organic EL layer 17, the second electrode 14, and the edge covers 18 are formed above the element substrate 10.

Note, in the above configuration, the organic EL element 4 includes the first electrodes 13 as anodes and the second electrode 14 as a cathode. In contrast, the organic EL element 4 may include the first electrodes 13 as cathodes and the second electrode 14 as an anode. In this case, the materials for both of the electrodes are switched, and the layers in the organic EL layer 17 are stacked in the reverse order.

Furthermore, in the above configuration, the organic EL element 4 includes the first electrodes 13 as transparent electrodes and the second electrode 14 as a reflective electrode. In this configuration, the organic EL display device 1 is a bottom-emitting element which emits light toward the element substrate 10 when observed from the organic EL element 4. In contrast, the first electrodes 13 may act as reflective electrodes and the second electrode 14 may act as a transparent electrode or a translucent electrode. In this case, the organic EL element 4 is a top-emitting element which emits light toward opposite side of the element substrate 10 when observed from the organic EL element 4.

Note, for example, that a crucible containing the evaporants is used as the evaporation source. The crucible is placed in a lower position in a chamber, and includes a heater, which heats the crucible.

The heat of the heater allows the temperature inside the crucible to reach the evaporation temperatures of the evaporants so that the evaporants contained in the crucible become evaporated molecules and rise upward and goes out of the chamber.

A specific example formation of the organic EL layer 17 and the second electrode 14 is as follows. First, the hole injection layer is formed, in common among all the RGB pixels, above the first electrodes 13 patterned on the element substrate 10. Containing m-MTDATA(4,4',4''-tris[phenyl (m-tolyl)amino]triphenylamine), the hole injection layer is formed via a mask with a thickness of, for example, 25 nm.

Then, the hole transport layer is formed, in common among all the RGB pixels, above the hole injection layer. Containing α-NPD(4,4'-bis[phenyl(1-naphtyl)amino]biphenyl), the hole transport layer is formed via a mask with a thickness of, for example, 30 nm.

Next, the light-emitting layer of red color is formed above the hole transport layer provided in the red pixel regions. Containing a mixture of 30 wt % of 2,-6bis(4'-methoxyphenyl)amino)styryl)-1,5-dicyanonaphthalene (BSN) with di(2-naphthyl)anthracene (ADN), the light-emitting layer of red color is formed via a mask with a thickness of, for example, 30 nm.

After that, the light-emitting layer of green color is formed above the hole transport layer provided in the green pixel regions. Containing a mixture of 5 wt % of coumarin 6 with ADN, the light-emitting layer of green color is formed via a mask with a thickness of, for example, 30 nm.

Then, the light-emitting layer of blue color is formed above the hole transport layer provided in the blue pixel regions. Containing a mixture of 2.5 wt % of 4,4'bis(2-[4-(N,N-diphenylamino)phenyl]vinyl)biphenyl (DPAVBi) with ADN, the light-emitting layer in blue color is formed via a mask with a thickness of, for example, 30 nm.

Next, the electron transport layer is formed, in common among all the RGB pixels, above the light-emitting layer of all the colors. Containing 8-hydroxyquinoline aluminum (Alq3), the electron transport layer is formed via a mask with a thickness of, for example, 20 nm.

After that, the electron injection layer is formed above electron transport layer. Containing lithium fluoride (LiF), the electron injection layer is formed via a mask with a thickness of, for for example, 0.3 nm. Then, the second electrode 14 containing aluminum (Al) is formed with a thickness of, for example, 10 nm by vacuum vapor deposition.

Figure 8:
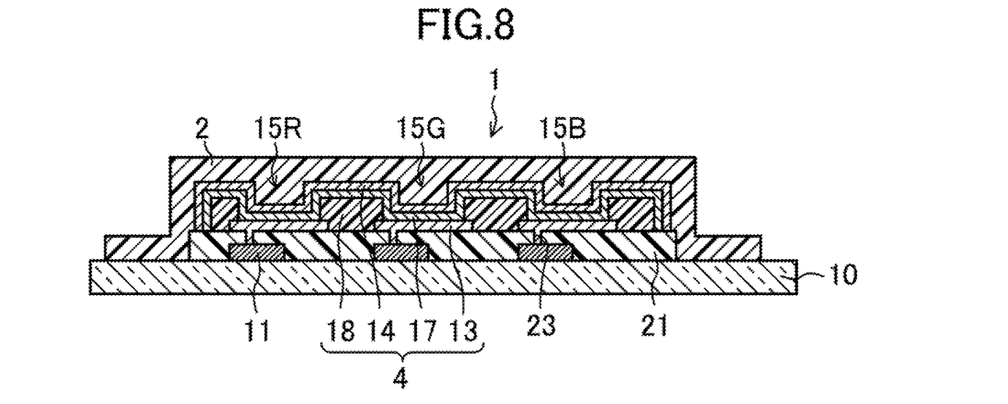
FIG. 8 is a cross-sectional view illustrating the method of manufacturing the organic EL display device according to the first embodiment.

After that, in a step shown in FIG. 8, the sealing film 2 is formed above the element substrate 10 to cover the organic EL element 4.

Specifically, in the step, such inorganic materials as silicon nitride (SiNx), silicon dioxide ($SiO_2$), and aluminum oxide ($Al_2O_3$) are deposited on surfaces of the element substrate 10 and the organic EL element 4 by plasma CVD, atomic layer deposition (ALD), and sputtering to form the barrier layer 31A with a thickness of approximately 0.3 μm. Next, such organic materials as acrylate, polyurea, parylene, polyimide, and polyamide are deposited on the surfaces of the element substrate 10 and the organic EL element 4 by plasma polymerization and vacuum vapor deposition or other methods to form the buffer layer 33 having a thickness of approximately 2.5 μm. Then, such inorganic materials as silicon nitride (SiNx), silicon dioxide ($SiO_2$), and aluminum oxide ($Al_2O_3$) are deposited on the surfaces of the element substrate 10 and the organic EL element 4 by plasma CVD, ALD, and sputtering to form the barrier layer 31B having a thickness of approximately 0.3 μm.

Note that the multilayer sealing film 2 may include at least one barrier layer and at least one buffer layer. Multiple barrier layers and buffer layers may alternately be provided.

(Second Embodiment)

Figure 9:
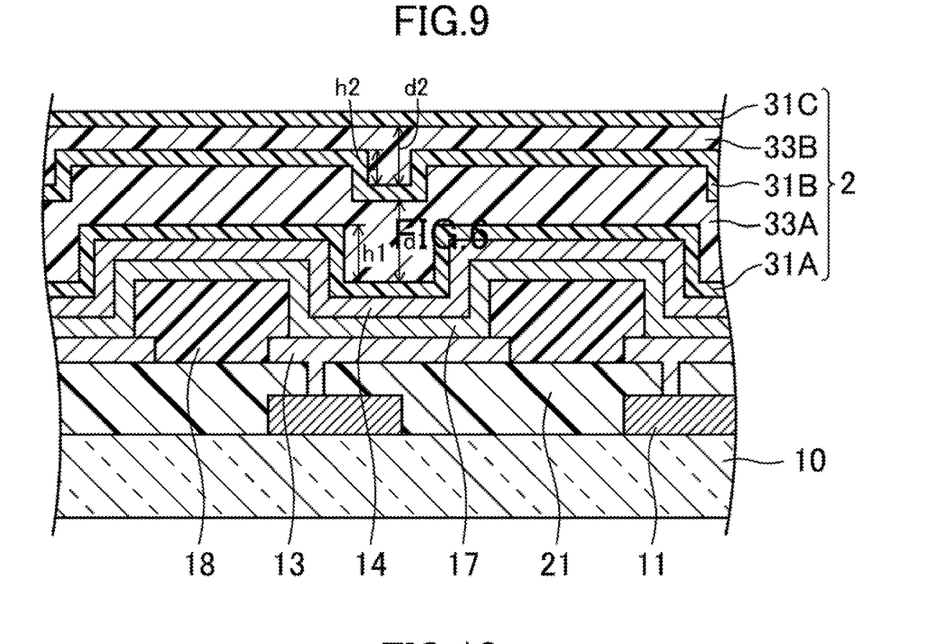
FIG. 9 is a cross-sectional view illustrating a structure of a multilayer sealing film in an organic EL display device according to a second embodiment.

FIG. 9 is a cross-sectional view illustrating a structure of a multilayer sealing film in an organic EL display device according to a second embodiment.

The organic EL display device of this embodiment is the same in configuration as the organic EL display device 1 according to the first embodiment except for a configuration of the multilayer sealing film 2. Described below is the configuration of the multilayer sealing film 2.

As shown in FIG. 9, the organic EL display device in this embodiment includes the multilayer sealing film 2 having the barrier layer 31A and the barrier layer 31B and a barrier layer 31C, and a buffer layer 33A and a barrier layer 33B. The barrier layers and the buffer layers are alternately stacked. Moreover, a relationship $(d1/h1)<2$ holds where h1 is a height of a protrusion directly below the buffer layer 33A and d1 is a thickness of the buffer layer 33A. Furthermore, a relationship $(d2/h2)<2$ holds where h2 is a height of a protrusion directly below the buffer layer 33B and d2 is a thickness of the buffer layer 33B.

The height h1 of the protrusion directly below the buffer layer 33A ranges approximately between 0.5 μm and 3 μm, for example. Here the height h1 is 1.6 μm. The thickness d1 of the buffer layer 33A approximately ranges between 0.3 μm and 5 μm. Here the thickness d1 is 2.5 μm. The height h2 of the protrusion directly below the buffer layer 33B ranges approximately between 0.2 μm and 1.5 μm, for example. Here the height h2 is 0.8 μm. The thickness d2 of the buffer layer 33B approximately ranges between 0.3 μm and 5 μm. Here the thickness d2 is 1.2 μm.

Thus, when the multilayer sealing film 2 includes (i) n buffer layers (where n is an integer larger than or equal to 2) or (ii) n barrier layers or (n+1) barrier layers, a relationship $(d_n/h_n)<2$ holds where $d_n$ is a thickness of an n-th buffer layer, from the bottom, among the n buffer layers and $h_n$ is a height of a protrusion directly below the n-th buffer layer. Note that in the above first embodiment, the relationship n=1 holds. In this case, the relationship $(d_n/h_n)<2$ also holds (where d1=d, and h1=h).

According to this structure, even though multiple buffer layers are provided, a continuous line of fracture does not develop in each buffer layer. Such a structure may effectively keep a film from delamination.

A thicker barrier layer causes a greater stress imposed on the underlayer, inducing film delamination on an interface between the barrier layer and the buffer layer. Hence, a barrier layer may have a thickness smaller than or equal to a certain thickness. The organic EL display device of this embodiment includes multiple barrier layers. Thus, even if each barrier layer is made thin, the barrier layers may keep an organic EL element from moisture and oxygen more effectively.

Furthermore, in the example shown in FIG. 9, the barrier layer 31A is a bottom-most layer of the multilayer sealing film 2. In this case, a height of a protrusion directly below each buffer layer is almost equal to a height of a protrusion of the organic EL element 4. More accurately, the height $h_n$ of the protrusion directly below the n-th buffer layer from the bottom is equal to a difference in level between (i) a top face of a portion, of the n-th barrier layer from the bottom, forming the protrusion and (ii) an other top face of a portion, of the n-th barrier layer from the bottom, formed between protrusions including the protrusion.

Figure 10:
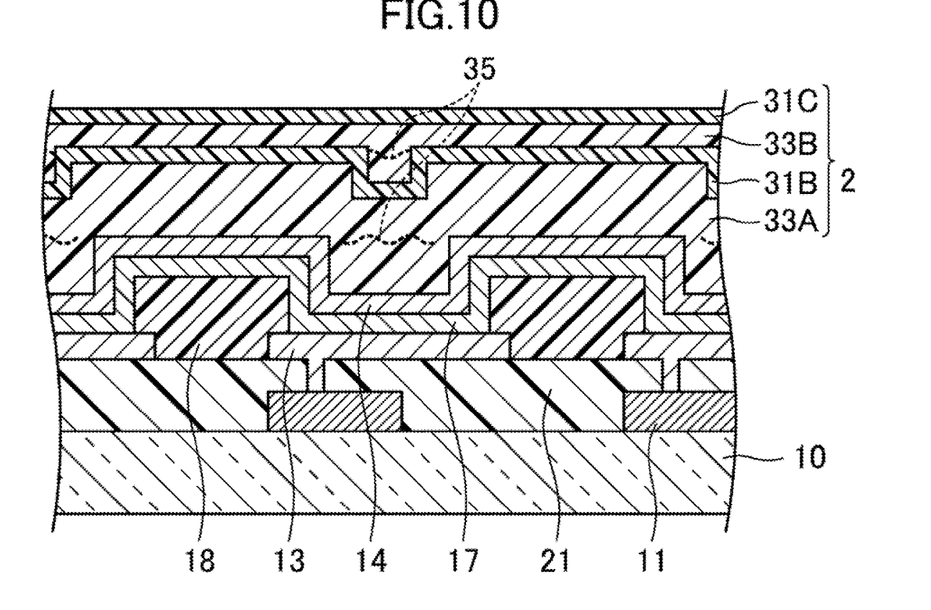
FIG. 10 is a cross-sectional view illustrating a structure of a multilayer sealing film in the organic EL display device according to a modification of the second embodiment.

Note that as shown in FIG. 10, the buffer layer 33A may be the bottom-most layer of the multilayer sealing film 2. In either case, alternately formed barrier layers and buffer layers may allow the buffer layers to reduce stress imposed from the barrier layers.

Moreover, when the buffer layer 33A is the bottom-most layer of the multilayer sealing film 2, the buffer layer 33A may effectively reduce the stress caused by the barrier layer 31B above the buffer layer 33A. Such a structure may keep a film from delamination. Furthermore, the buffer layer 33A may be provided directly above the organic EL element 4. Such a structure may keep the organic EL element 4 from a damage to be caused by a plasma treatment and a UV treatment employed when the barrier layer 31B is formed.

(Third Embodiment)

Figure 11:
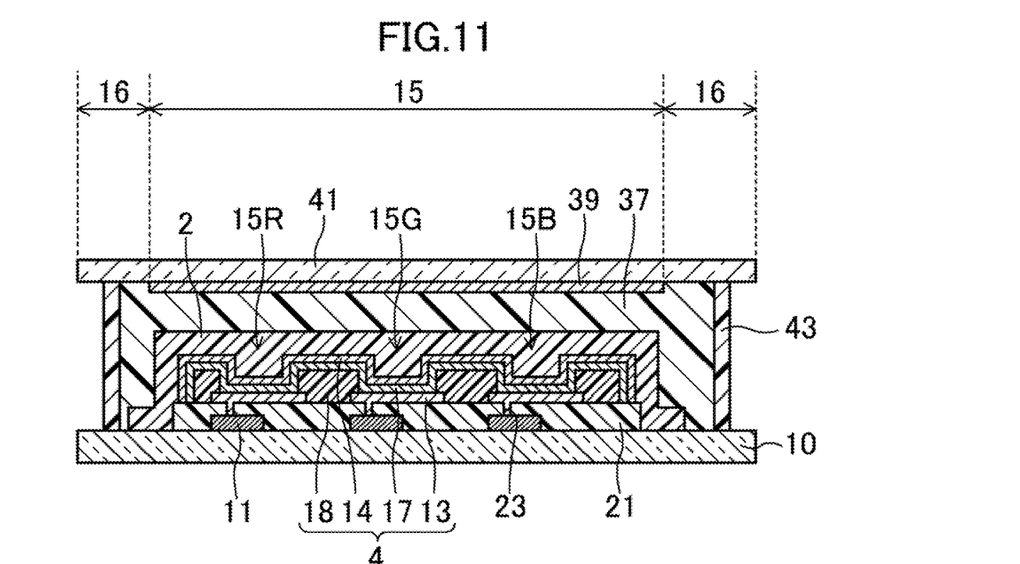
FIG. 11 is a cross-sectional view illustrating an organic EL display device according to a third embodiment.
Figure 12:
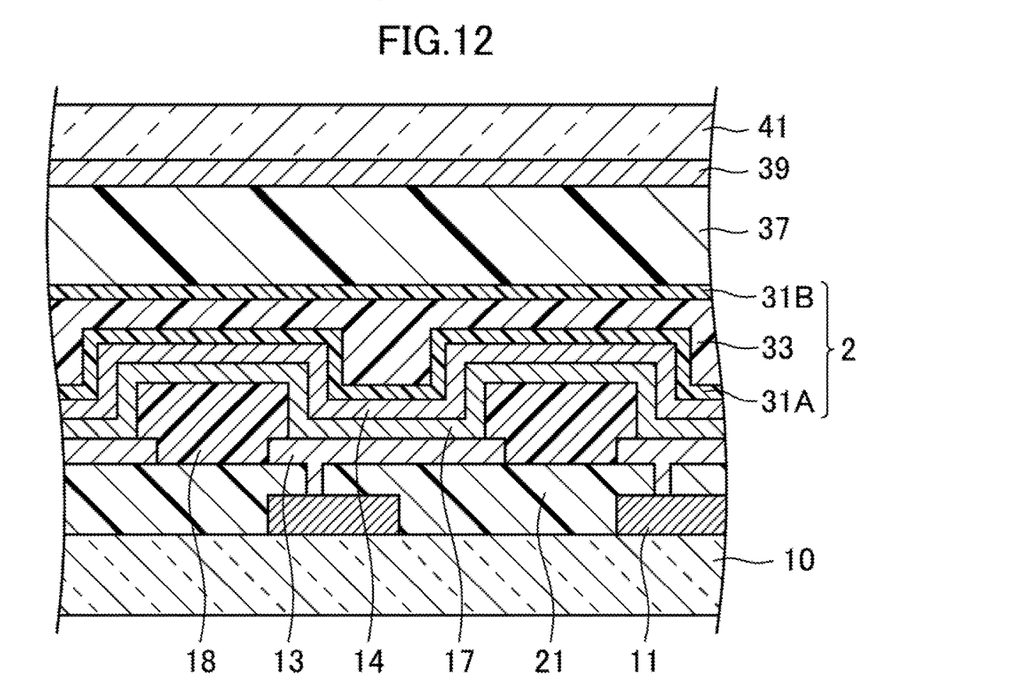
FIG. 12 is an enlarged cross-sectional view illustrating the organic EL display device according to the third embodiment.

FIG. 11 is a cross-sectional view illustrating an organic EL display device according to a third embodiment. FIG. 12 is an enlarged cross-sectional view illustrating the organic EL display device according to the third embodiment.

The organic EL display device of this embodiment includes: a sealing substrate 41 facing the element substrate 10 and acting as a second substrate; and a sealing material 43 interposed between the element substrate 10 and the sealing substrate 41 and boding the element substrate 10 and the sealing substrate 41 together to seal the organic EL element 4. Moreover, the organic EL display device of this embodiment includes: a filler 37 filled in a gap between the organic EL element 4 and the sealing substrate 41; and a color filter 39 provided to a undersurface of the sealing substrate 41. The filler 37 may function as a getter (i.e., a function to adsorb oxygen and moisture). Furthermore, the organic EL element 4 is a top-emitting element, and emits light toward the sealing substrate 41 via the color filter 39. Except for the above configurations, the organic EL display device of this embodiment is the same in configuration as the organic EL display device 1 according to the first embodiment.

Hence, as illustrated in FIG. 12, the relationship (d/h)<2 holds where d is a thickness of the buffer layer 33 and h is a height of a protrusion covered with the buffer layer 33. The height h of the protrusion ranges approximately between 0.5 μm and 3 μm, for example. Here, the height h is 1.6 μm. The thickness d of the buffer layer 33 ranges approximately between 0.3 μm and 5 μm as described above. Here, the thickness is 2.5 μm.

Such a structure allows a line of fracture to be less likely to develop in the buffer layer 33, effectively reducing delamination of the multilayer sealing film 2.

A material for filler 37 includes a curable material such as an epoxy resin or a non-curable material such as a silicon resin. In view of improving adsorption of moisture, the filler 37 contains an alkaline earth metal oxide such as calcium oxide (CaO) and barium oxide (BaO) and a desiccant such as silica gel and zeolite.

The sealing material 43 to bond the element substrate 10 and the sealing substrate 41 together is for securing the element substrate 10 and sealing substrate 41. Materials for the sealing material 43 may include such ultraviolet (UV) curable resins as an epoxy resin and an acrylic resin, and such moisture-permeable materials as a thermosetting resin. Note that the sealing material 43 may be omitted when a curable filler is used and the curable filler and the multilayer sealing film 2 reliably keep the organic EL display element 4 from moisture and oxygen.

As shown in FIG. 11, in the organic EL display device 1, a frame region (i.e., a seal formation region) 16 in which the sealing material 43 is placed is defined around the display region 15. As shown in FIG. 11, the sealing material 43 is provided in the frame region 16 and shaped into a frame above the multilayer sealing film 2 to seal the organic EL element 4, and bonds the element substrate 10 and the sealing substrate 41 together.

The color filter 39 functions to modulate light emitted from the organic EL element 4. For example, when the organic EL element 4 emits white light, the color filter 39 having an RGB pattern modulates the white light coming from each pixel region into the colors of R, G, and B.

When the pixel regions emit respective R, G, and B light rays, the white light passes through a color pattern, of the color filter 39, corresponding to one of the light rays. Such a feature may improve color purity of each color and reduce a shift of tinge observed when a viewing angle changes. When the color filter 39 is provided, the color filter 39 and the element substrate 10 may be positioned for each pixel, and then the element substrate 10 and the sealing substrate 41 with which the color filter 39 is previously provided may be bonded together.

Note that the color filter 39 may be omitted when a single color is acceptable for the emitted light and the color purity and the shift of tinge are nothing to do with the emitted light.

Moreover, employing substrates which bend or curve as the element substrate 10 and the sealing substrate 41 makes it possible to produce a flexible display and a bendable display.

Note that a gap spacer (not shown) may be provided above the element substrate 10 to reduce the risk that the sealing substrate 41 hits the element substrate 10, damaging the organic EL element 4.

The organic EL display device of this embodiment may effectively keep the organic EL element 4 from external moisture and oxygen, contributing to reliably reducing deterioration of the organic EL element 4.

Next, such a material as the above epoxy resin is applied onto the sealing substrate 41, using dispending, mask printing, screen printing, or other methods to form the sealing material 43 into a frame shape. Here, an example of the sealing substrate 41 is a glass substrate having a substrate size of 320 mm×400 mm, and a thickness of 0.7 mm.

Note that the sealing material 43 may include a spacer (not shown) to regulate a gap between the element substrate 10 and the sealing substrate 41. This spacer contains for example, silicon dioxide ($SiO_2$).

Moreover, in this embodiment, an epoxy resin is beneficially used as a material for the sealing material 43, and a viscosity of the material ranges between 100 Pa·s and 1000 Pa·s. However, the viscosity shall not be limited to this range as long as the material can be patterned by, for example, lithographing with dispending or screen printing as described above.

Furthermore, when an epoxy resin is used as a material for the sealing material 43, the epoxy resin may act as a desiccant. When the sealing material 43 is cured, a material for the sealing material 43 beneficially produces no (or little) outgas. In view of reducing damage to the light-emitting layer, the material for the sealing material 43 is beneficially low in shrinkage when the sealing material 43 is cured.

When a thermosetting material is used for the sealing material 43, the thermosetting material may beneficially be curable at or below 100° C., taking thermal influence on the light-emitting layer into consideration. Beneficially, the sealing material 43 is low in moisture permeation.

After that, the material for the filler 37 is applied, apart from the sealing material 43, inside the sealing material 43 on the sealing substrate 41 by dispending, mask printing, drop injection, or other methods. In place of an applicable material, a sheet-like material may also be used.

Next, in a vacuum atmosphere, the sealing substrate 41 provided with the sealing material 43 is stacked above the element substrate 10 provided with the organic EL element 4 so that the material overlaps the organic EL element 4. A surface of the sealing material 43 on the sealing substrate 41 is placed on a surface of the multilayer sealing film 2 in the frame region 16.

Then, under a predetermined condition (e.g., under a pressure of 100 Pa or lower), the interior of the sealing material 43 is kept in airtight vacuum. In the vacuum atmosphere, the sealing substrate 41 is moved toward the element substrate 10 and pressurized with the sealing material 43 sandwiched between the sealing film 2 and the sealing substrate 41. As a result, the element substrate 10 and the sealing substrate 41 are bonded together via the sealing material 43.

Next, after purging the vacuum state to the atmospheric pressure (i.e., bringing the vacuum state back to an atmospheric pressure state), the sealing substrate 41 is irradiated with ultraviolet (UV) light so that the resin forming the sealing material 43 cures. As a result, the organic EL display device shown in FIG. 11 is manufactured.

The above organic EL display devices are examples of the embodiments of the present disclosure. Such factors as a size, a shape, and a manufacturing condition of each member may receive any given modification unless otherwise departing from the scope of the present disclosure.

For example, in the above embodiments, the organic EL display device 1 has been described as an example of a display device. Instead, the present disclosure may be applicable to other display devices such as a liquid crystal display.

EXAMPLE

Inventors of this application made the organic EL display device 1 illustrated in FIGS. 1 and 2, and studied whether the multilayer sealing film 2 would delaminate. An organic silicon polymer was used as a material for the buffer layer 33. Silicon nitride was used as a material for the barrier layer 31A and the barrier layer 31B respectively placed below and above the buffer layer 33. The barrier layer 31A and the barrier layer 31B each had a thickness of 0.5 µm. The buffer layer 33 had a Vickers hardness of 26.

The stacked sealing films 2 were formed so that pairs of the thickness d of the buffer layer 33 and the height h of the protrusion from an underlayer (d, h) were determined as follows: (0.43 µm, 1.5 µm), (0.48 µm, 0.7 µm), (2.5 µm, 1.6 µm), (2.7 µm, 1.4 µm), (2.8 µm, 1.2 µm), and (2.3 µm, 0.8 µm). Then, the multilayer sealing film 2 was checked for delamination. Specifically, adhesive cellophane tape (manufactured by, for example, Nichiban Co., Ltd.) was attached to the multilayer sealing film 2. Then, the attached tape was stripped off with a hand at a speed of approximately 100 cm/s. Here, the inventors observed visually and microscopically whether the multilayer sealing film 2 had separated from the underlayer and had been attached to the stripped tape. Table 1 shows the results.

TABLE 1

| Thickness of Buffer Layer d (µm) | Height of Protrusion from an Underlayer h (µm) | d/h | Film Separation |
|---|---|---|---|
| 0.43 | 1.5 | 0.3 | No |
| 0.48 | 0.7 | 0.7 | No |
| 2.5 | 1.6 | 1.6 | No |
| 2.7 | 1.4 | 1.9 | No |
| 2.8 | 1.2 | 2.3 | Yes |
| 2.3 | 0.8 | 2.9 | Yes |

The results in Table 1 show that the inventors observed no film delamination when the value d/h was smaller than at least 2.0, and film delamination when the value d/h was 2.0 or greater.

Moreover, the inventors of this application checked whether the multilayer sealing film 2 would delaminate when a material contained in the buffer layer 33 was changed so that the hardness of the buffer layer 33 changed. The buffer layer 33 had a thickness of 2 and the barrier layer 31A and the barrier layer 31B each had a thickness of 0.5 µm.

A Vickers hardness of the buffer layer 33 was measured by a method which complies with ISO14577. Specifically, the inventors measured the Vickers hardness with a microhardness tester (e.g., H100C manufactured by Fischer Instruments K.K.), using a specimen formed on glass to have a thickness ranging between 0.5 µm and 2 µm. Table 2 shows the results of the measurement.

TABLE 2

| Vickers Hardness | Film Separation |
|---|---|
| 80 | No |
| 68 | No |
| 58 | No |
| 49 | No |
| 42 | No |
| 35 | Yes |

The results in Table 2 show that, on a planarized surface, no film separation was observed when the Vickers hardness was 42 or higher, and film delamination was observed when the Vickers hardness was as low as 35. In contrast, when the value d/h was smaller than 2.0, the inventors observed no film delamination even though the Vickers hardness was decreased to as low as 26.

The buffer layer 33 having a lower hardness is likely to reduce more effectively a stress imposed from the barrier layer 31B. Since the organic EL display device 1 of this embodiment reduces the risk of film delamination, the buffer layer 33 to be used may be lower in hardness than a typical buffer layer, contributing to reducing the risk of film delamination while maintaining barrier performance of the multilayer sealing film 2.

INDUSTRIAL APPLICABILITY

As can be seen, the organic EL display devices according to examples of the present disclosure may be applicable to such various appliances equipped with display devices as TVs and cellular phones.

DESCRIPTION OF REFERENCE CHARACTERS

1 Organic EL Display
2 Stacked Sealing Film
4 Organic EL Element
10 Element Substrate
11 TFT
13 First Electrode
14 Second Electrode
15 Display Region
15B, 15G, 15R Pixel Region
16 Frame Region
17 Organic EL Layer
18 Edge Cover
21 Interlayer Insulating Film
23 Contact Hole
31A, 31B, 31C Barrier Layer
33, 33A, 33B Buffer Layer
35 Line of Fracture
37 Filler
39 Color Filter
41 Sealing Substrate
43 Sealing Material

The invention claimed is:
1. An organic EL display device comprising:
a first substrate:
an organic EL element provided above the first substrate; and
a multilayer sealing film provided above the first substrate to cover the organic EL element, the multilayer sealing film including a barrier layer and a buffer layer, the buffer layer having a lower hardness than the barrier layer, wherein
the organic EL element covered with the multilayer sealing film includes at least one protrusion, and wherein (d/h)<2 and h<d, where h is a height of the at least one protrusion on the bottom surface of the buffer layer and d is a thickness of the buffer layer between the at least one protrusion and another protrusion on the bottom surface of the buffer layer adjacent to the at least one protrusion.

2. The organic EL display device of claim 1, wherein the multilayer sealing film includes n buffer layers, the n buffer layers including the buffer layer, where n is an integer greater than or equal to 2, an n-th buffer layer having at least one protrusion on a bottom surface thereof, and wherein $(d_n/h_n)<2$, where $d_n$ is a thickness of the n-th buffer layer, from a bottom of the sealing film, among the n buffer layers and $h_n$ is a height of the at least one protrusion on the bottom surface of the n-th buffer layer.

3. The organic EL display device of claim 2, wherein the barrier layer includes n barrier layers or (n+1) barrier layers, and the barrier layer and the buffer layer are alternately provided.

4. The organic EL display device of claim 3, wherein the barrier layer is a bottom-most layer of the multilayer sealing film.

5. The organic EL display device of claim 4, wherein the height h of the protrusion on the bottom surface of the n-th buffer layer from the bottom is equal to a difference in level between (i) a top face of a portion, of the n-th barrier layer from the bottom, forming the protrusion and (ii) an other top face of a portion, of the n-th barrier layer from the bottom, formed between protrusions including the protrusion.

6. The organic EL display device of claim 1, further comprising:

a second substrate provided above the first substrate and the organic EL element; and a filler filled between the multilayer sealing film and the second substrate.

7. The organic EL display device of claim 1, wherein the barrier layer is a top-most layer of the multilayer sealing film.

8. The organic EL display device of claim 1, wherein the barrier layer contains an inorganic material.

9. The organic EL display device of claim 1, wherein the buffer layer contains an organic material.

10. The organic EL display device of claim 1, wherein the organic EL display device is a flexible display.

11. The organic EL display device of claim 1, wherein the organic EL element contains polysiloxane, silicon oxycarbide, acrylate, polyurea, parylene, polyimide, or polyamide.

12. The organic EL display device of claim 1, further comprising:

first electrodes arranged in a matrix; and edge covers provided to cover peripheral edges of the first electrodes and regions in which the first electrodes are not provided, wherein each of the edge covers forms the protrusion and the other protrusion.

13. The organic EL display device of claim 12, wherein the edge covers cover all the peripheral edges of the first electrodes.

14. The organic EL display device of claim 1, wherein the multilayer sealing film further includes n buffer layers, wherein n is an integer greater than or equal to 2, the n buffer layers includes the buffer layer, wherein an n-th buffer layer having at least one protrusion on a bottom surface of the n-th buffer layer, the at least one protrusion on the bottom surface of the n-th buffer layer overlaps with one protrusion of each of the other buffer layers in a direction perpendicular to the first substrate.

15. The organic EL display device of claim 14, wherein (d1/h1)<2 and h1<d1, where h1 is a height of the at least one protrusion on the bottom surface of the buffer layer and d is a thickness of the buffer layer between the at least one protrusion and another protrusion on the bottom surface of the buffer layer adjacent to the at least one protrusion.

16. The organic EL display device of claim 15, wherein $(d_n/h_n)<2$ and $h_n<d_n$, where $d_n$ is a thickness of the n-th buffer layer, and $h_n$ is a height of the at least one protrusion on the bottom surface of the n-th buffer layer.

17. The organic EL display device of claim 16, wherein $h1>h_n$ and $d1>d_n$.

* * * * *